(12) United States Patent
Dusad et al.

(10) Patent No.: US 9,013,226 B2
(45) Date of Patent: Apr. 21, 2015

(54) CIRCUITS FOR IMPROVING LINEARITY OF METAL OXIDE SEMICONDUCTOR (MOS) TRANSISTORS

(71) Applicant: Texas Instruments Incorporated, Dallas, TX (US)

(72) Inventors: Shagun Dusad, Bangalore (IN); Visvesvaraya Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/627,396

(22) Filed: Sep. 26, 2012

(65) Prior Publication Data

US 2014/0084982 A1 Mar. 27, 2014

(51) Int. Cl.
*H03K 17/16* (2006.01)

(52) U.S. Cl.
CPC .............. *H03K 17/16* (2013.01); *H03K 17/165* (2013.01)

(58) Field of Classification Search
CPC ............................ H03K 17/16; H03K 17/165
USPC ......... 327/427, 434, 109, 306, 308, 317, 323, 327/331, 332
See application file for complete search history.

(56) References Cited

U.S. PATENT DOCUMENTS

| | | | | |
|---|---|---|---|---|
| 5,563,545 A | * | 10/1996 | Scheinberg | 327/389 |
| 2003/0016072 A1 | * | 1/2003 | Ramakrishnan | 327/434 |
| 2003/0179034 A1 | * | 9/2003 | Melis et al. | 327/427 |
| 2010/0123521 A1 | * | 5/2010 | Bach | 330/278 |
| 2012/0256674 A1 | * | 10/2012 | Foroudi | 327/308 |

* cited by examiner

*Primary Examiner* — Jung Kim
(74) *Attorney, Agent, or Firm* — Steven A. Shaw; Frank D. Cimino

(57) ABSTRACT

Various embodiments of circuits configured to improve second order harmonic distortion of Metal Oxide Semiconductor (MOS) transistors operating in linear region are provided. In one embodiment, a circuit includes an averaging circuit configured to average signals at a drain and a source of a MOS transistor and provide the averaged signal to a gate of the MOS transistor, and one or more current sources coupled with the gate; the circuit is configured to vary voltage at the gate so as to vary a resistance of the MOS transistor. The averaging circuit comprises a first MOS circuit coupled between the drain and the gate, a first capacitor coupled in parallel to the first MOS circuit between the drain and the gate, a second MOS circuit coupled between the source and the gate, and a second capacitor coupled in parallel to the second MOS circuit between the source and the gate.

14 Claims, 2 Drawing Sheets

CIRCUITS FOR IMPROVING LINEARITY OF METAL OXIDE SEMICONDUCTOR (MOS) TRANSISTORS

TECHNICAL FIELD

The present disclosure generally relates to metal oxide semiconductor (MOS) circuits.

BACKGROUND

In a number of exemplary applications utilizing electronic components, Metal Oxide Semiconductor (MOS) transistors are used as resistors. In such applications, a MOS transistor operating in linear region is used as a resistor. In the linear region of operation of the MOS transistor, by changing a gate voltage of the MOS transistor, resistance of the MOS transistor is changed. In the linear region, current through the MOS transistor may be represented by the equation:

$$I = K \times ((V_{GS} - V_{th}) \times V_{DS} - V_{DS}^2/2) \qquad (1),$$

where K is a proportionality constant, VGS is a voltage across the gate and source nodes of the MOS transistor, VDS is a voltage across the drain and source nodes of the MOS transistor, and Vth is a threshold voltage of the MOS transistor.

In many exemplary scenarios, there may be a signal swing present at one or more nodes, such as source or drain of the MOS transistor, which can cause distortion with respect to signal linearity of the MOS transistor. For example, if a signal swing Vd is present at the drain, the current in equation (1) may be represented by the equation:

$$I = K \times ((V_{GS} - V_{th}) \times (V_{DS} + V_d) - (V_{DS} + V_d)^2/2) \qquad (2).$$

The above equation (2) shows that the current has second harmonic (hereinafter referred to as 'HD2') distortion. In some exemplary scenarios, such distortion may be suppressed by providing an average of signal swings associated with the drain and source (for example, (Vd+Vs)/2, where Vd is the signal swing at the drain and Vs is the signal swing at the source) at the gate. In one exemplary scenario, in case of a single ended input (e.g., Vs is 0) and where the gate voltage is kept as (VG+Vd/2), the current through the MOS transistor becomes:

$$I = K \times ((V_{GS} - V_{th}) \times (V_{DS} + V_d) - (V_{DS} + V_d) \times V_{DS}/2) \qquad (3).$$

It is noted that the current in equation (3) is linear, as it does not contain HD2 distortion. It is further noted that, though a number of exemplary circuits average the signals present at the source and drain and provide the averaged signal at the gate, however performing the averaging over a wide range of frequency may be a challenge when the gate voltage needs to be varied at a considerable rate in applications such as ultrasound receiver.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A number of circuits for improving the linearity of MOS transistors are disclosed herein. In an embodiment, a circuit is disclosed for improving the linearity of a Metal Oxide Semiconductor (MOS) transistor in linear region. The circuit includes an averaging circuit configured to provide an average of signals at a drain and a source of the MOS transistor to a gate of the MOS transistor, and one or more current sources configured to vary voltage at the gate of the MOS transistor and vary a resistance of the MOS transistor.

In an embodiment, the averaging circuit includes a first MOS circuit, a first capacitor, a second MOS circuit and a second capacitor. The first MOS circuit is coupled or connected between a first node and a second node, where the first node is configured to be coupled with or connected to the drain of the MOS transistor and the second node is configured to be coupled with or connected to the gate of the MOS transistor, and the first MOS circuit is configured to provide a signal at the second node that is responsive to a signal at the first node. The first capacitor is coupled or connected in parallel to the first MOS circuit between the first node and the second node. The second MOS circuit is coupled or connected between a third node and the second node, where the third node is configured to be coupled with or connected to the source of the MOS transistor and the second MOS circuit is configured to provide a signal at the second node that is responsive to a signal at the third node. The second capacitor is coupled or connected in parallel with the second MOS circuit between the third node and the second node. Further, the one or more current sources are coupled with or connected to a second node, configured to vary currents in the first MOS circuit and the second MOS circuit so as to vary the voltage at the gate of the MOS transistor and vary resistance of the MOS transistor.

Additionally, in an embodiment, a MOS resistor is disclosed. The MOS resistor includes a MOS transistor having a drain, a source and a gate configured to operate in linear region as a resistor, and an averaging circuit configured to provide a signal at the gate that is responsive to the signals at the drain and the source. The MOS resistor further includes one or more current sources coupled with or connected to the gate and configured to vary the voltage at the gate, thereby varying resistance of the MOS transistor.

In an embodiment, the averaging circuit includes a first MOS circuit coupled or connected between the drain of the MOS transistor and the gate of the MOS transistor, a first capacitor coupled or connected in parallel with the first MOS circuit between the drain and the gate, a second MOS circuit coupled or connected between the source of the MOS transistor and the gate, and a second capacitor coupled or connected in parallel with the second MOS circuit between the source and the gate. The one or more current sources are coupled with or connected to the gate and configured to vary currents in the first MOS circuit and the second MOS circuit to vary the voltage at the gate, thereby varying resistance of the MOS transistor.

Other aspects and example embodiments are provided in the drawings and the detailed description that follows.

DETAILED DESCRIPTION

Figure 1:
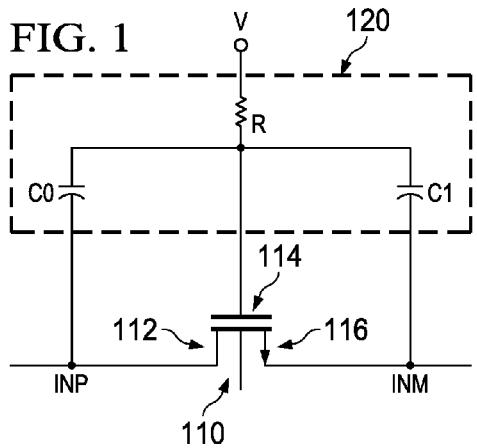
FIG. 1 is a an exemplary circuit configured to improve signal linearity of a MOS transistor according to an exemplary scenario.

Pursuant to an exemplary scenario, a scheme configured to improve signal linearity of a MOS transistor is shown in FIG. 1. It is noted that improving the linearity of the MOS transistor provides, among other benefits, an ability to vary the resistance of the MOS transistor with reduced second order harmonic distortion (hereinafter referred to as 'HD2 distortion') in the MOS transistor while the MOS transistor operates as a resistor in linear region. FIG. 1 represents a MOS transistor 110 that is used as a resistor in the linear region. Moreover, FIG. 1 represents a circuit 120 that is configured to reduce the HD2 distortion caused due to a signal swing at the drain or source terminals of the MOS transistor 110. The circuit 120 is coupled with or connected to the MOS transistor 110 and is configured to improve a signal linearity of the MOS transistor. The drain and source terminals are shown as 'INP' and 'INM', respectively, in FIG. 1.

The circuit 120 includes capacitors 'C0' and 'C1' and a resistor R. The capacitor 'C0' is coupled or connected between a drain 112 of the MOS transistor 110 and a gate 114 of the MOS transistor 110, and the capacitor 'C1' is coupled or connected between the gate 114 and a source 116 of the MOS transistor 110. The capacitors 'C0' and 'C1' cause a signal averaging at the gate 114. As at a high signal frequency, the impedance of capacitors C0 and C1 is much lower than resistor R, so R does not affect the averaging. Also the value of C0 and C1 may be chosen such a way so that any parasitic capacitance (with respect to ground (GND)) does not affect the averaging. Further, a bias/Direct Current (DC) voltage at the gate 114 is controlled by the resistor 'R'. For example, the voltage at the gate 114 may be varied by selecting a suitable value of resistor 'R' and/or applying a suitable voltage source (see, exemplary voltage source 'V') that controls the voltage at the gate 114 of the MOS transistor 110. Accordingly, resistance of the MOS transistor 110 may be varied by varying the voltage at the gate 114.

In accordance with an exemplary implementation, a drawback of the exemplary circuit 120 occurs when a low frequency signal is introduced (e.g., at 'INP' or 'INM'). In order to achieve a low level of HD2 distortion, a time constant, such as, for example, R*Cequ (where 'Cequ' is an equivalent capacitance of 'C0' and 'C1') may be selected to be sufficiently greater than 1/fsignal (fsignal is a signal frequency). At the low frequency, in order to maintain a condition where R*Cequ is sufficiently greater than 1/fsignal, large values of R0, C0 and C1 are implemented. This results in a lower rate at which the voltage at the gate 114 can be varied, as the rate is affected by the RC time constant. Accordingly, herein, the rate at which the resistance of the MOS transistor 110 may be varied is significantly lower than the signal frequency.

Pursuant to a number of exemplary embodiments, in many exemplary applications involving electronic circuits, such as ultrasound receivers, gain or attenuation are varied with time at a certain rate (as it is a system requirement in such applications) over a wide signal frequency range, and this objective is achieved by utilizing a MOS resistance, wherein this resistance needs to be varied with time with low HD2 distortion for wide signal frequency range. Various embodiments of the present technology may be implemented to improve linearity of the MOS resistor over a wide signal frequency range while improving (e.g., diminishing) the HD2 distortion. For example, various embodiments of the present technology provide the benefit of varying the resistance of a MOS transistor with time with low HD2 distortion for wide signal frequency range.

Figure 2:
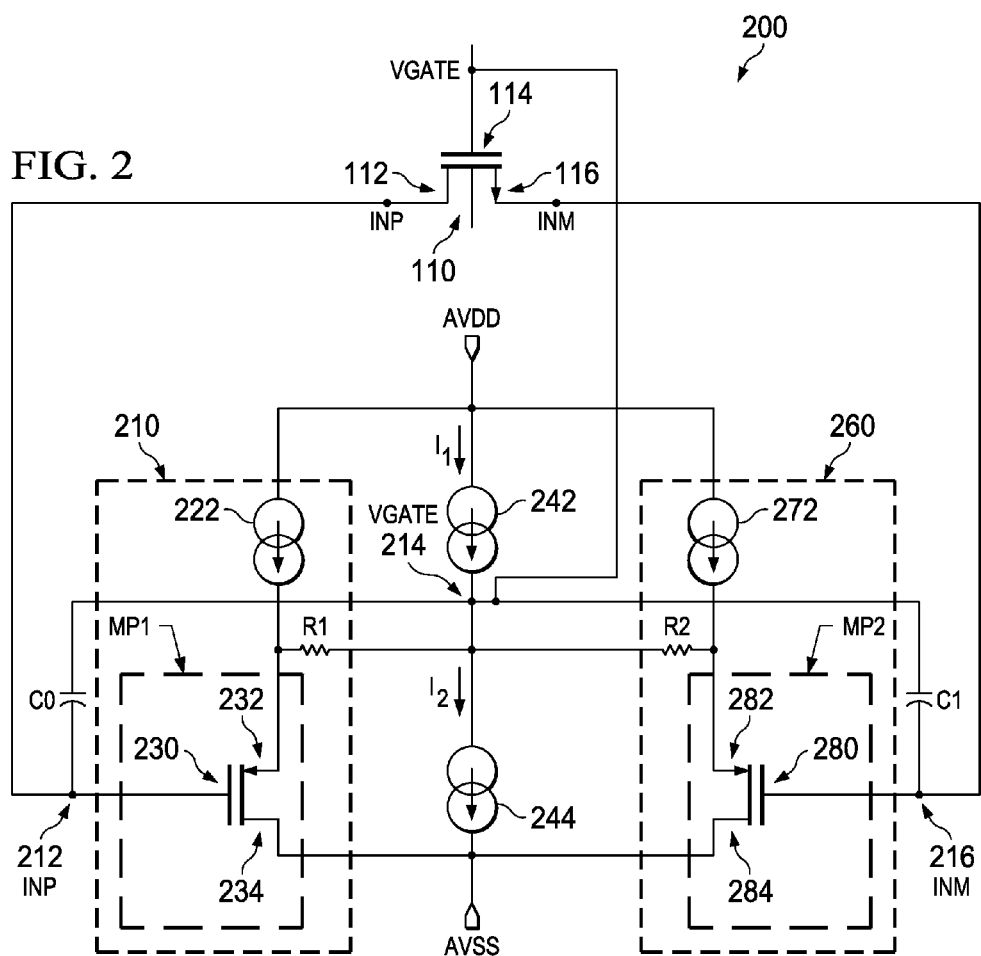
FIG. 2 is a circuit configured to improve signal linearity of a MOS transistor according to an embodiment.

FIG. 2 represents an exemplary circuit 200 configured to provide a degree of linearity to a MOS transistor, such as the MOS transistor 110, such that the MOS transistor 110 may be used as a resistor in the linear region over a wide signal frequency range. The circuit 200 includes an averaging circuit configured to provide an average of the signals at the drain 112 and the source 116 of the MOS transistor 110 to the gate 114 of the MOS transistor 110. The circuit 200 also includes one or more current sources configured to vary the voltage at the gate 114 of the MOS transistor and vary the resistance of the MOS transistor 110.

In the embodiment shown in FIG. 2, the averaging circuit includes a first MOS circuit 210 coupled or connected between a first node 212 and a second node 214. In the embodiment shown in FIG. 2, the node 212 is configured to be coupled with or connected to the drain 112 of the MOS transistor 110, and the node 214 is configured to be coupled with or connected to the gate 114 of the MOS transistor 110. The first MOS circuit 210 is configured to provide a signal responsive to the node 212 at the node 214. For example, as the node 212 is coupled with or connected to the drain 112 and the node 214 is coupled with or connected to the gate 114, the first MOS circuit 210 is configured to provide a signal at the gate 114 in response to a signal at the drain 112. In the embodiment shown in FIG. 2, the averaging circuit also includes a first capacitor 'C0' coupled or connected in parallel with the first MOS circuit 210 between the node 212 and the node 214.

The averaging circuit also includes a second MOS circuit 260 coupled or connected between a third node 216 and the second node 214. In the embodiment shown in FIG. 2, the node 216 is configured to be coupled with or connected to the source 116 of the MOS transistor 110. The second MOS circuit 260 is configured to provide a signal responsive to the node 216 at the node 214. For example, as the node 216 is coupled with or connected to the source 116 and the node 214 is coupled with or connected to the gate 114, the second MOS circuit 260 is configured to provide a signal at the gate 114 in response to a signal at the source 116. In the embodiment shown in FIG. 2, the averaging circuit also includes a second capacitor 'C1' coupled or connected in parallel to the second MOS circuit 260 between the node 214 and the node 216.

The averaging circuit is configured to perform an averaging of the signals at the drain 112 and the source 116 of the MOS transistor 110 and provide the averaged signal at the node 214 to thereby feed the averaged signal to the gate 114 (since the node 214 is configured to be coupled with or connected to the gate 114). For instance, in an example, if the signal at the drain 112 is Vd (shown by 'INP' at the node 212) and the signal at the source 116 is Vs (shown by 'INM' at the node 216), the averaging circuit causes the signal at the node 214 (shown by Vgate at the gate 114) to be substantially equal to (Vd+Vs)/2 in the signal frequency range.

It should be noted that the averaging circuit includes two parallel paths between the nodes 212 and 214 (for coupling or connecting the drain 112 with the gate 114), and two parallel paths between the nodes 216 and 214 (for coupling or connecting the source 116 with the gate 114) so as to carry out the averaging of signals at the drain 112 and the source 116 and provide the averaged signal at the gate 114. For example, in an embodiment, the first MOS circuit 210 and the first capacitor 'C0' are arranged, coupled or positioned in parallel between the nodes 212 and 214. Similarly, the second MOS circuit 260 and the second capacitor 'C1' are arranged, coupled or positioned in parallel between the nodes 216 and 214.

In an embodiment, the first capacitor 'C0' and the second capacitor 'C1' are configured to provide an averaging of the signals present at the drain 112 and the source 116 when these signals are of high frequency. In order to average the high signal frequency, capacitors 'C0' and 'C1' may be used as in the exemplary circuit of FIG. 1. In accordance with an exemplary implementation, the drawback of the exemplary circuit 120, while performing a signal averaging at a low frequency, is addressed by the performing the signal averaging with the first MOS circuit 210 and the second MOS circuit 260 at the low signal frequency. At the low signal frequency, the respective impedances of the capacitors 'C1' and 'C2' increase (as high impedances of the capacitors 'C1' and 'C2' tend to block low-frequency signals), and, accordingly, these low frequency signals at the drain 112 and the source 116 are averaged through the first MOS circuit 210 and the second MOS circuit 260, respectively, and the averaged signal is provided to the gate 114. So, herein, the resistance of the MOS transistor 110 may be varied at a reasonable rate because averaging at low signal frequency is achieved by the first MOS circuit 210 and the second MOS circuit 260 and not by increasing the RC time constant (i.e., the case in the exemplary scenario of FIG. 1). It should be noted that herein the terms 'a low frequency' (for example, a first frequency) and a 'high frequency' (for example, a second frequency) are relative to the RC time constant, which in turn depends on the rate at which the resistance of the MOS transistor 110 needs to be varied.

In various embodiments, the first MOS circuit 210 and the second MOS circuit 260 may include one or more source follower MOS circuits and one or more resistors. For example, the first MOS circuit 210 includes a source follower MOS circuit comprising a first PMOS transistor (e.g., MP1) coupled with or connected to a current source 222 and a first resistor 'R1', and the second MOS circuit 260 includes a source follower MOS circuit comprising a second PMOS transistor (e.g., MP2) coupled with or connected to a current source 272 and a resistor 'R2'. In some embodiments, the values of 'R1' and 'R2' may be same, and/or capacitances of 'C0' and 'C1' may be same. Furthermore, although examples of the source follower MOS circuit in the FIG. 2 include PMOS transistors, it is noted that the present technology is not limited to the implementation of PMOS transistors. For example, in other embodiments, NMOS, Field Effect Transistors (FETs), and Bipolar Junction Transistors (BJTs) may be utilized to configure source follower MOS circuits.

As shown in FIG. 2, the node 212 is coupled with or connected to the node 214 via the first PMOS transistor (source follower) 'MP1' and the resistor 'R1'. The first PMOS transistor 'MP1' has a gate node 230 that is coupled with or connected to the first node 212 and is configured to receive the signal at the drain 112 of the MOS transistor 110. The resistor 'R1' is coupled or connected between a source node 232 of 'MP1' and the node 214. Accordingly, the source follower 'MP1' follows the signal at the drain 112 and provides a signal at the node 214 (to the gate 114) that is responsive to the signal present at the drain 112. Similarly, the second PMOS transistor 'MP2' has a gate node 280 coupled with or connected to the third node 216 and is configured to receive the signal at the source 116 of the MOS transistor 110. The resistor 'R2' is coupled or connected between a source node 282 of 'MP2' and the node 214. Accordingly, the source follower 'MP2' follows the signal at the source 116 and provides a signal at the node 214 (to the gate 114) that is responsive to the signal present at the source 116. Further, a drain node 234 of the 'MP1' and a drain node 284 of the 'MP2' are coupled with or connected to a substrate voltage (see, AVSS). Accordingly, the PMOS transistors 'MP1' and 'MP2' help the MOS transistor 110 to achieve a better degree of linearity for low signal frequencies.

In various embodiments, in order to change the resistance of the MOS transistor 110, the voltage at the gate 114 of the MOS transistor 110 is changed by varying currents through the one or more current sources, such as, for example, through a current source 242 and a current sink 244. In the embodiment shown in FIG. 2, the current source 242 is arranged, coupled or positioned between a power supply (see, AVDD) and the second node 214, and the current sink 244 is arranged, coupled or positioned between the second node 214 and a substrate voltage (see, AVSS). In various embodiments, the first node 212, the second node 214 and the third node 216 are used for description purposes to represent nodes in the circuit 200, and, in some embodiments, these nodes may be the same as the drain 112, the gate 114 and the source 116, respectively.

In some examples, if a current flowing through the current source 242 (for example, 'I1') and/or a current through the current sink 244 (for example, 'I2') is varied, currents flowing through the resistances 'R1' and 'R2' change, and, accordingly, the voltage at the node 214 (see, VGATE) also changes, thereby causing the voltage at the gate 114 to change. In this manner, by changing the voltage at the gate 114, the resistance of the MOS transistor 110 is also varied. For example, if the current 'I2' in current sink 244 is reduced, the increased remaining current (I1 minus I2) flows through the resistor 'R1' and 'R2', which increases the VGATE voltage, and, accordingly, the resistance of the MOS transistor 110 reduces. Similarly, if the current 'I2' in current sink 244 is increased, the reduced remaining current (I1 minus I2) flows through the resistor 'R1' and 'R2', which will decrease the VGATE voltage, and, accordingly, the resistance of the MOS transistor increases. It should be noted that the resistance of the MOS transistor 110 can also be varied, for example, by varying the current through the current source 242 while keeping the current through the current sink 244 constant.

It should be further noted that, in the circuit 200, the capacitors 'C0' and 'C1' are utilized to perform averaging at a higher signal frequency, and the transistors 'MP1' and 'MP2' are utilized to perform an averaging at a lower signal frequency of signals at the drain 112 and the source 116. Accordingly, this embodiment of the present technology may be utilized in applications where change in gain across wide signal frequency range is to be achieved based on varying the resistance of the MOS transistor 110, and the low RC time constant is required for changing the gain at a reasonable rate. For example, the capacitor averaging (by 'C0' and 'C1') is utilized for a high signal frequency (as the impedance of the capacitors 'C0' and 'C1' is lower for the higher signal frequency). Further, for the low signal frequency, the capacitor averaging is decoupled (as the impedances of the capacitor 'C0' and 'C1' are large), and the averaging is performed through the transistors 'MP1' and 'MP2'. In this manner, various embodiments of the present technology enable varying the resistance of the MOS resistor 110 with time with low HD2 distortion for a wide signal frequency range that includes a low signal frequency and a high signal frequency.

Figure 3:
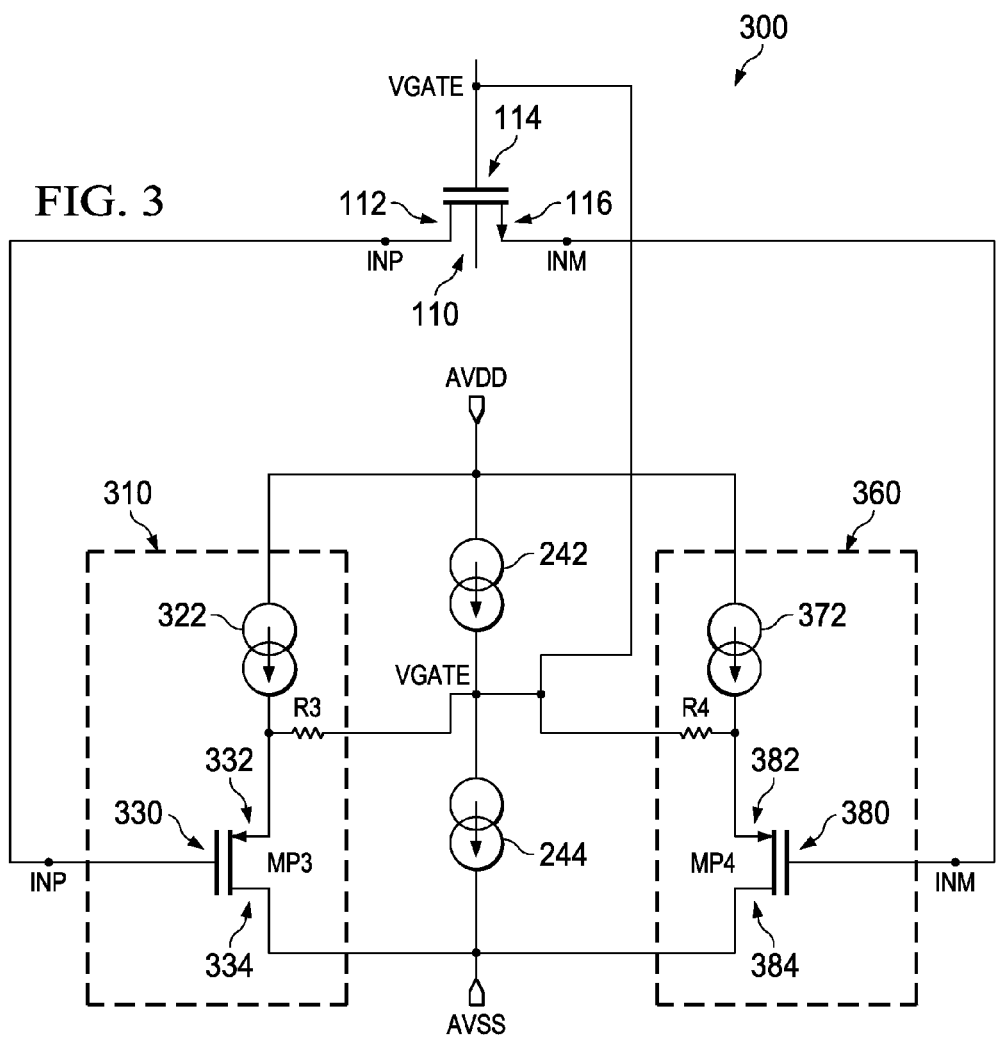
FIG. 3 is a circuit configured to improve a signal linearity of a MOS transistor according to another embodiment.

Referring now to FIG. 3, a circuit 300 is shown that can be utilized to vary the resistance of a MOS transistor used in linear region in accordance with an embodiment of the present technology. In an embodiment, the averaging circuit does not include capacitors, such as 'C0' and 'C1', as averaging paths; instead, the MOS circuits having source follower MOS circuits associated with higher bandwidths are utilized to average the signals at the source and the drain of the MOS transistor.

In an embodiment, the averaging circuit includes a first MOS circuit 310 and a second MOS circuit 360. The first MOS circuit 310 is coupled or connected between a drain, such as the drain 112, to a gate, such as the gate 114 of the MOS transistor 110, and is configured to provide a signal at the gate 114 responsive to a signal present at the drain 112. For example, in the embodiment shown in FIG. 3, the first MOS circuit 310 includes a source follower MOS circuit (e.g., a first PMOS transistor 'MP3' coupled with or connected to a current source 322) and a resistor 'R3'. A gate node 330 of the 'MP3' is coupled with or connected to the drain 112 and is configured to receive a signal at the drain 112; the current source 322 is coupled or connected between a power supply (see, AVDD) and a source node 332 of the 'MP3'; and the resistor 'R3' connects the source node 332 to the gate 114.

The second MOS circuit 360 is coupled or connected between a source, such as the source 116, and the gate 114 of the MOS transistor 110, and is configured to provide a signal at the gate 114 that is responsive to a signal present at the source 116. In the embodiment shown in FIG. 3, the second MOS circuit 360 includes a source follower MOS circuit (e.g., a second PMOS transistor 'MP4' coupled with or connected to a current source 372) and a resistor 'R4'. A gate node 380 of the 'MP4' is coupled with or connected to the source 116 and is configured to receive a signal at the source 116; the current source 372 is coupled or connected between the power supply (see, AVDD) and a source node 382 of the 'MP4', and the resistor 'R3' couples or connects the source node 382 with the gate 114. Further, a drain node 334 of the 'MP3' and a drain node 384 of the 'MP4' are coupled with or connected to a substrate voltage (see, AVSS). In some embodiments, the first MOS circuit 310 and the second MOS circuit 360 may also include NMOS transistors, NPN transistors, PNP transistors and FETs as the source follower circuit.

In an embodiment, PMOS source followers (e.g., MP3 and MP4) are of higher bandwidths, and these transistors can perform averaging at both the low and high signal frequencies, thus eliminating (or enabling the avoidance of) the implementation of capacitors such as 'C0' and 'C1'. Further, the circuit 300 includes one or more current sources, such as, for example, the current source 242, and a current sink, such as, for example, the current sink 244, so as to vary the voltage of the gate 114. Accordingly, the resistance of the MOS transistor 110 may be varied with time over a wide signal frequency range with low HD2 distortion.

In accordance with a number of exemplary implementations, various embodiments of the present technology provide improved HD2 distortion over a wide range of signal frequencies as compared to the exemplary circuit 120. Indeed, for purposes of comparison, HD2 distortion levels (measured in decibels (dB)) for circuits 120, 200 and 300 are tabulated for different signal frequencies (measured in megahertz (MHz)) in Table 1.

TABLE 1

| Signal Frequency | HD2 distortion for the exemplary circuit 120 | HD2 Distortion for the circuit 200 or the circuit 300 |
|---|---|---|
| 1 MHz | −14 dB | −30 dB |
| 10 MHz | −18 dB | −30 dB |
| 50 MHz | −30 dB | −30 dB |

For the simulation of the HD2 distortion provided in Table 1, a single ended input of the MOS transistor 110 is considered. For example, INP is assumed to be equal (or substantially equal) to 400 millivolts (mV), peak-to-peak, and an overdrive voltage (VGST) corresponding to the MOS transistor 110 is assumed to be 210 mV for both the exemplary circuit 120 and the circuits 200 or 300. Values of 'R0', 'C0' and 'C1' are chosen such that the exemplary circuit 120 provides −30 dB HD2 at 50 MHz for the MOS transistor 110. In order to keep the RC time constant the same in both cases, the resistances of R1 and R2 (in FIGS. 2 and 3) are assumed to be twice that of R (see FIG. 1), and values of C0 and C1 are assumed to be the same in both cases. As evident from the values of HD2 distortion for the signal frequencies 1 MHz, 10 MHz and 50 MHz, the circuits 200 or 300 offer a consistent and reduced HD2 distortion for these signal frequencies as compared to the circuit 120 of the exemplary scenario for which the HD2 distortion increases with lower signal frequencies.

Although the present technology has been described with reference to specific exemplary embodiments, it is noted that various modifications and changes may be made to these embodiments without departing from the broad spirit and scope of the present technology. For example, the various devices, modules, analyzers, generators, etc., described herein may be enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., application specific integrated (ASIC) circuitry and/or in Digital Signal Processor (DSP) circuitry), and the drawings are to be regarded in an illustrative rather than a restrictive sense.

Also, the circuits described and illustrated in the various embodiments as discrete or separate may be combined or integrated with other systems, modules, or circuits without departing from the scope of the present technology. Other items shown or discussed as directly coupled or communicating with each other may be coupled through some interface or device, such that the items may no longer be considered directly coupled to each other but may still be indirectly coupled and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

What is claimed is:

1. A circuit for improving linearity of a Metal Oxide Semiconductor (MOS) transistor comprising a gate, a source and a drain, the circuit comprising:
    an averaging circuit configured to provide a signal at the gate in response to signals at the drain and the source, the averaging circuit comprising:
        a first MOS circuit configured to be coupled between the drain and the gate, wherein the first MOS circuit comprises:
            a source follower MOS circuit comprising:
                a first PMOS transistor having a gate node coupled with the drain of the MOS transistor, and
                a first current source coupled between a power supply and a source node of the first PMOS transistor; and
                a first resistor coupling the source node of the first PMOS transistor with the gate of the MOS transistor, and
        a second MOS circuit configured to be coupled between the source and the gate; and
    one or more current sources coupled with the gate, the one or more current sources configured to vary currents in the first and second MOS circuits so as to vary a voltage at the gate and thereby vary a resistance of the MOS transistor.

2. The circuit of claim 1, wherein the second MOS circuit comprises:

a source follower MOS circuit comprising:
  a second PMOS transistor having a gate node configured to be coupled with the source of the MOS transistor, and
  a second current source coupled between the power supply and a source node of the second PMOS transistor; and
  a second resistor coupling the source node of the second PMOS transistor with the gate of the MOS transistor.

3. The circuit of claim 2, wherein a drain node of the first PMOS transistor and a drain node of the second PMOS transistor are coupled with a substrate voltage.

4. A circuit for improving linearity of a Metal Oxide Semiconductor (MOS) transistor comprising a gate, a source and a drain, the circuit comprising:
  an averaging circuit configured to provide a signal at the gate in response to signals at the drain and the source, the averaging circuit comprising:
    a first MOS circuit configured to be coupled between the drain and the gate, and
    a second MOS circuit configured to be coupled between the source and the gate; and
  one or more current sources coupled with the gate, the one or more current sources configured to vary currents in the first and second MOS circuits so as to vary a voltage at the gate and thereby vary a resistance of the MOS transistor, wherein the one or more current sources comprises a current source coupled between a power supply and the gate and a current sink coupled between the gate and a substrate voltage.

5. The circuit of claim 4, wherein at least one of the current source and the current sink is configured to provide a variable current.

6. A circuit, comprising:
  an averaging circuit configured to be coupled with a Metal Oxide Semiconductor (MOS) transistor, the MOS transistor comprising a gate, a source and a drain, and the averaging circuit configured to provide an average of signals at the drain and the source to the gate, the averaging circuit comprising:
    a first MOS circuit coupled between a first node and a second node, the first node configured to be coupled with the drain, the second node configured to be coupled with the gate, and the first MOS circuit configured to provide a signal at the second node in response to a signal at the first node, wherein the first MOS circuit comprises:
      a source follower MOS circuit comprising:
        a first PMOS transistor having a gate node coupled with the first node, and
        a first current source coupled between a power supply and a source node of the first PMOS transistor; and
        a first resistor coupling the source node of the first PMOS transistor with the second node,
    a first capacitor coupled in parallel with the first MOS circuit between the first node and the second node,
    a second MOS circuit coupled between a third node and the second node, the third node configured to be coupled with the source, and the second MOS circuit configured to provide a signal at the second node that is responsive to a signal at the third node, and
    a second capacitor coupled in parallel with the second MOS circuit between the third node and the second node,
    wherein the first MOS circuit and the second MOS circuit are configured to average the signals at the drain and the source at a first signal frequency, and wherein the first capacitor and the second capacitor are configured to average the signals at the drain and the source at a second signal frequency, the second signal frequency being higher than the first signal frequency; and
  one or more current sources coupled with the second node, the one or more current sources configured to vary currents in the first and second MOS circuits so as to vary a voltage at the second node and thereby vary a voltage at the gate for varying a resistance of the MOS transistor.

7. The circuit of claim 6, wherein the second MOS circuit comprises:
  a source follower MOS circuit comprising:
    a second PMOS transistor having a gate node coupled with the third node, and
    a second current source coupled between the power supply and a source node of the second PMOS transistor; and
    a second resistor coupling the source node of the second PMOS transistor with the second node.

8. The circuit of claim 7, wherein a drain node of the first PMOS transistor and a drain node of the second PMOS transistor are coupled with a substrate voltage.

9. A circuit, comprising:
  an averaging circuit configured to be coupled with a Metal Oxide Semiconductor (MOS) transistor, the MOS transistor comprising a gate, a source and a drain, and the averaging circuit configured to provide an average of signals at the drain and the source to the gate, the averaging circuit comprising:
    a first MOS circuit coupled between a first node and a second node, the first node configured to be coupled with the drain, the second node configured to be coupled with the gate, and the first MOS circuit configured to provide a signal at the second node in response to a signal at the first node,
    a first capacitor coupled in parallel with the first MOS circuit between the first node and the second node,
    a second MOS circuit coupled between a third node and the second node, the third node configured to be coupled with the source, and the second MOS circuit configured to provide a signal at the second node that is responsive to a signal at the third node, and
    a second capacitor coupled in parallel with the second MOS circuit between the third node and the second node; and
  one or more current sources coupled with the second node, the one or more current sources configured to vary currents in the first and second MOS circuits so as to vary a voltage at the second node and thereby vary a voltage at the gate for varying a resistance of the MOS transistor, wherein the one or more current sources comprises a current source coupled between a power supply and the second node and a current sink coupled between the second node and a substrate voltage.

10. The circuit of claim 9, wherein at least one of the current source and the current sink is configured to provide a variable current.

11. The circuit of claim 9, wherein the first resistor and the second resistor have substantially equal resistances.

12. The circuit of claim 9, wherein the first capacitor and the second capacitor have substantially equal capacitances.

13. A Metal Oxide Semiconductor (MOS) resistor, comprising:
  a MOS transistor having a drain, a source and a gate, configured to operate in linear region as a resistor;

an averaging circuit configured to provide a signal at the gate in response to signals at the drain and the source, the averaging circuit comprising:
- a first MOS circuit coupled between the drain and the gate, wherein the first MOS circuit comprises:
  - a source follower MOS circuit comprising:
    - a first PMOS transistor having a gate node coupled with the drain of the MOS transistor, and
    - a first current source coupled between a power supply and a source node of the first PMOS transistor; and
    - a first resistor coupling the source node of the first PMOS transistor with the gate of the MOS transistor,
- a first capacitor coupled in parallel with the first MOS circuit between the drain and the gate,
- a second MOS circuit coupled between the source and the gate, and
- a second capacitor coupled in parallel with the second MOS circuit between the source and the gate; and one or more current sources coupled with the gate, the one or more current sources configured to vary currents in the first MOS circuit and the second MOS circuit so as to vary a voltage at the gate and thereby vary a resistance of the MOS transistor.

14. A Metal Oxide Semiconductor (MOS) resistor, comprising:
- a MOS transistor having a drain, a source and a gate, configured to operate in linear region as a resistor;
- an averaging circuit configured to provide a signal at the gate in response to signals at the drain and the source, the averaging circuit comprising:
  - a first MOS circuit coupled between the drain and the gate,
  - a first capacitor coupled in parallel with the first MOS circuit between the drain and the gate,
  - a second MOS circuit coupled between the source and the gate, wherein the second MOS circuit comprises:
    - a source follower MOS circuit comprising:
      - a second PMOS transistor having a gate node configured to be coupled with the source of the MOS transistor, and
      - a second current source coupled with between the power supply and a source node of the second PMOS transistor; and
      - a second resistor coupling the source node of the second PMOS transistor with the gate of the MOS transistor, and
  - a second capacitor coupled in parallel with the second MOS circuit between the source and the gate; and
- one or more current sources coupled with the gate, the one or more current sources configured to vary currents in the first MOS circuit and the second MOS circuit so as to vary a voltage at the gate and thereby vary a resistance of the MOS transistor.

* * * * *